United States Patent
Kutz et al.

(10) Patent No.: US 8,106,637 B2
(45) Date of Patent: Jan. 31, 2012

(54) PROGRAMMABLE FLOATING GATE REFERENCE

(75) Inventors: Harold Kutz, Edmonds, WA (US); Warren Snyder, Snohomish, WA (US); Thurman J. Rodgers, Woodside, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 382 days.

(21) Appl. No.: 12/104,678

(22) Filed: Apr. 17, 2008

(65) Prior Publication Data

US 2008/0315847 A1 Dec. 25, 2008

Related U.S. Application Data

(60) Provisional application No. 60/912,399, filed on Apr. 17, 2007.

(51) Int. Cl.
G05F 1/46 (2006.01)
G05F 3/16 (2006.01)

(52) U.S. Cl. .................. 323/265; 323/313; 327/541

(58) Field of Classification Search ............ 323/234, 323/265, 311, 313, 349; 327/537, 541; 365/185.2, 365/185.18
See application file for complete search history.

(56) References Cited

U.S. PATENT DOCUMENTS

| | | | | |
|---|---|---|---|---|
| 5,099,191 | A | * | 3/1992 | Galler et al. .................. 323/313 |
| 5,184,061 | A | * | 2/1993 | Lee et al. ...................... 323/265 |
| 5,497,119 | A | * | 3/1996 | Tedrow et al. ................ 327/540 |
| 5,844,404 | A | * | 12/1998 | Caser et al. ................... 323/314 |
| 6,552,933 | B2 | * | 4/2003 | Roohparvar ............. 365/185.18 |
| 6,894,928 | B2 | | 5/2005 | Owen |
| 7,034,603 | B2 | | 4/2006 | Brady et al. |
| 2004/0240278 | A1 | * | 12/2004 | Brady et al. ............. 365/189.09 |
| 2007/0189069 | A1 | * | 8/2007 | Negut et al. ................. 365/185.2 |
| 2009/0322305 | A1 | * | 12/2009 | De Cremoux ................ 323/313 |

OTHER PUBLICATIONS

United States PCT Office, International Search Report, Sep. 12, 2008, 2 pgs.

\* cited by examiner

*Primary Examiner* — Adolf Berhane
*Assistant Examiner* — Fred E Finch, III

(57) ABSTRACT

A system includes a controllable voltage generator to generate a power supply voltage. The system also includes a system controller to determine a voltage level associated with the power supply voltage, and prompt the controllable voltage generator to generate the power supply voltage. The system includes a floating gate reference device to generate an absolute voltage reference based, at least in part, on the voltage level associated with the power supply voltage. The system can also include analog circuitry to perform one or more electrical operations responsive to the absolute voltage reference from the floating gate reference device.

20 Claims, 4 Drawing Sheets

PROGRAMMABLE FLOATING GATE REFERENCE

RELATED APPLICATIONS

This application claims the benefit of U.S. Provisional Application No. 60/912,399, filed Apr. 17, 2007, which is incorporated herein by reference.

TECHNICAL FIELD

This disclosure relates generally to electronic circuits, and more particularly to floating gate reference devices.

BACKGROUND

Electronic systems often require a stable supply voltage for analog circuitry, such as analog-to-digital converters, etc. Variation in a voltage of a supply voltage can have a dramatic affect on the operation of the analog circuitry. In some instances, the voltage variations can force the analog circuitry to provide non-accurate signal output, or render the electronic circuit non-operational.

Many electronic systems include voltage generators or reference circuits, such as bandgap devices, and zener diode or threshold voltage $V_t$ systems, to provide the absolute power reference. These absolute reference circuits, however, can be complicated to implement, difficult to control, and/or consume a large amount of chip area.

SUMMARY

A system comprising a controllable voltage generator to generate a power supply voltage, a system controller to determine a voltage level associated with the power supply voltage, and prompt the controllable voltage generator to generate the power supply voltage with the determined voltage level, and a floating gate reference device to generate an absolute voltage reference based, at least in part, on the voltage level associated with the power supply voltage.

The system controller can generate voltage control signals identifying the voltage level for the power supply voltage, and the controllable voltage generator to generate the power supply voltage according to voltage control signals. The system can include a comparator to compare the absolute voltage reference with a reference voltage and to generate a feedback signal according to the comparison, the system controller to generate the voltage control signals based, at least in part, on the feedback signal.

The system controller can receive the absolute voltage reference from the floating gate reference device and to generate the voltage control signals based, at least in part, on the absolute voltage reference. The system can include analog circuitry to perform one or more electrical operations responsive to the absolute voltage reference, where the system controller is operable to generate voltage control signals based, at least in part, on operational characteristics of the analog circuitry and the absolute voltage reference.

The floating gate reference device can include a tunneling device to generate a current according to the power supply voltage from the controllable voltage generator, a storage capacitor to store a floating voltage when charged by the current from the tunneling device, and an output buffer to buffer the floating voltage and output the buffered floating voltage as the absolute reference voltage. The tunneling device can be a transistor with a bulk region, source region, and drain region connected to receive the power supply voltage, where the tunneling device is operable to provide the current to a gate region of the transistor when the power supply voltage exceeds a threshold voltage level.

A method comprising determining a voltage level associated with a power supply voltage, generating the power supply voltage to the determined voltage level, and generating an absolute voltage reference with a floating gate reference device based, at least in part, on the voltage level associated with the power supply voltage.

The method can further include generating voltage control signals identifying the voltage level associated with the power supply voltage responsive to the determining, and generating the controllable power supply voltage according to voltage control signals.

The method can further include receiving the absolute voltage reference from the floating gate reference device, and generating the voltage control signals based, at least in part, on the absolute voltage reference.

The method can further include comparing the absolute voltage reference with a reference voltage, generating a feedback signal according to the comparison of the absolute voltage reference and the reference voltage, and generating the voltage control signals based, at least in part, on the feedback signal.

The method can further include providing the absolute voltage reference to analog circuitry, the analog circuitry to perform one or more electrical operations responsive to the absolute voltage reference. The method can further include generating voltage control signals based, at least in part, on operational characteristics of the analog circuitry.

A system comprising a system controller to determine a voltage level associated with a controllable power supply voltage, a floating gate reference device to generate an absolute voltage reference based, at least in part, on the controllable power supply voltage, and analog circuitry to perform one or more electrical operations responsive to the absolute voltage reference from the floating gate reference device.

The system controller can receive the absolute voltage reference from the floating gate reference device and to generate the voltage control signals based, at least in part, on the absolute voltage reference. The system can include a comparator to compare the absolute voltage reference with a reference voltage and to generate a feedback signal according to the comparison, the system controller to generate the voltage control signals based, at least in part, on the feedback signal. The system controller can generate voltage control signals based, at least in part, on operational characteristics of the analog circuitry and the feedback signal.

The floating gate reference device can include a tunneling device to generate a current according to the controllable power supply voltage, a storage element to store a floating voltage when charged by the current from the tunneling device, and an output buffer coupled to the storage element and the tunneling device, the output buffer to buffer the floating voltage and to output the buffered floating voltage as the absolute reference voltage.

The tunneling device is a transistor with a bulk region, source region, and drain region connected to receive the controllable power supply voltage, where the tunneling device is operable to provide the current to a gate region of the transistor when the controllable power supply voltage exceeds a threshold voltage level. A voltage level of the floating voltage corresponds to a size of the storage element and the current from the tunneling device.

DESCRIPTION OF THE DRAWINGS

The invention may be best understood by reading the disclosure with reference to the drawings.

DETAILED DESCRIPTION

A system on a chip (SOC) or other electronic system can include one or more floating gate reference devices to produce an absolute voltage reference for powering one or more analog circuits. The system on a chip can also include a microcontroller to control operations of the floating gate reference devices, particularly, to direct a power supply voltage provided to the floating gate reference devices by a voltage pump. Embodiments are shown and described below in greater detail.

Figure 1:
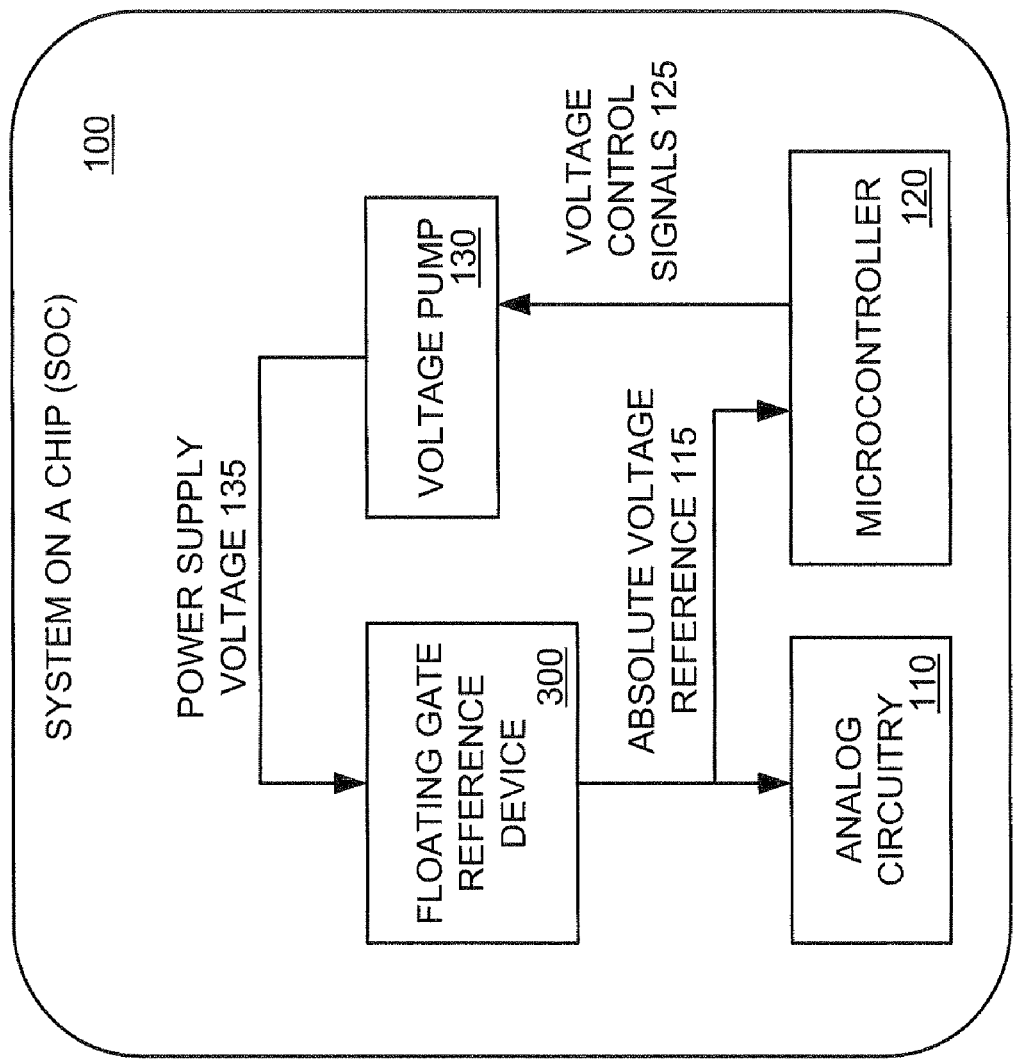
FIG. 1 is a block diagram of an example system on a chip having a floating gate reference device according to embodiments of the invention.

FIG. 1 is a block diagram of an example system on a chip 100 having a floating gate reference device 300 according to embodiments of the invention. Referring to FIG. 1, the system on a chip 100 includes a floating gate reference device 300 to generate an absolute voltage reference 115, for example, to be utilized by analog circuitry 110. The analog circuitry 110 can include one or more analog electronic devices, such as analog-to-digital converters, or other electronic hardware elements. The absolute voltage reference 115 can remain substantially constant over time relative to changes in environmental conditions, such as temperature.

The floating gate reference device 300 can receive a power supply voltage 135 from a voltage pump 130 and generate the absolute voltage reference 115 based on the power supply voltage 135. In some embodiments, the power supply voltage 135 can have a relatively high voltage level, which can cause the floating gate reference device 300 to tunnel electrons through an insulator to charge a floating gate region of the floating gate reference device 300. Embodiments of the floating gate reference device 300 will be described below in greater detail.

The system on a chip includes a microcontroller 120 to control the voltage pump 130 and thus the power supply voltage 135 provided to the floating gate reference device 300. By controlling the power supply voltage 135, the microcontroller 120 can effectively control the operation of the floating gate reference device 300 and the generation of the absolute voltage reference 115. The microcontroller 120 can be a processor, microprocessor, or other controlling device, and in some embodiments, can be implemented in firmware or as a discrete set of hardware elements. Although not shown in FIG. 1, the microcontroller 120 can be coupled to a computer or machine readable medium or other memory device that include instructions, when executed by the microcontroller 120, can cause the microcontroller 120 to perform various functions or operations.

The microcontroller 120 can receive the absolute voltage reference 115 directly from the floating gate reference device 300, or through an intermediate device within the system on a chip 100, such as an analog-to-digital converter (not shown). The microcontroller 120 can generate voltage control signals 125 based, at least in part, on the absolute voltage reference 215, and provide the voltage control signals 125 to the voltage pump 130. For instance, the microcontroller 120 can determine when the absolute voltage reference 115 has reached a threshold voltage level and generate voltage control signals 125 that direct the voltage pump 130 to cease providing (or reduce the voltage level) the power supply voltage 135 to the floating gate reference device 300. The voltage pump 130 can be a variable voltage source that is dynamically programmable or controllable responsive to the voltage control signals 125 from the microcontroller 120.

The microcontroller 120 can be programmed or designed to understand the operation of the floating gate reference device 300, particularly, the effect varying the power supply voltage 135 has on the generation of the absolute voltage reference 115. The microcontroller 120 can then generate control signals 125 based, at least in part, on the operational characteristics of the floating gate reference device 300 and the effect variations in the power supply voltage 135 have on the generation of the absolute voltage reference 115.

The microcontroller 120 can be programmed or designed to generate the voltage control signals 125 with an understanding of the characteristics of analog circuitry 110 that receives the absolute voltage reference 115, particularly, the effect variation in the absolute voltage reference 115 can have on the operation of the analog circuitry 110. The microcontroller 120 can then generate control signals 125 based, at least in part, on the characteristics of the analog circuitry 110. For instance, operations of analog circuit devices can be adversely impacted when losing an absolute voltage reference 115, and therefore the microcontroller 120 can delay shutting off or reducing the power supply voltage 135 provided to the floating gate reference 300 in an attempt to avoid the adverse consequences. The delay can be programmable based on the characteristics of the particular analog circuit device receiving the absolute voltage reference 115, or can be determined dynamically by monitoring the operation of the analog circuitry 110.

Figure 2:
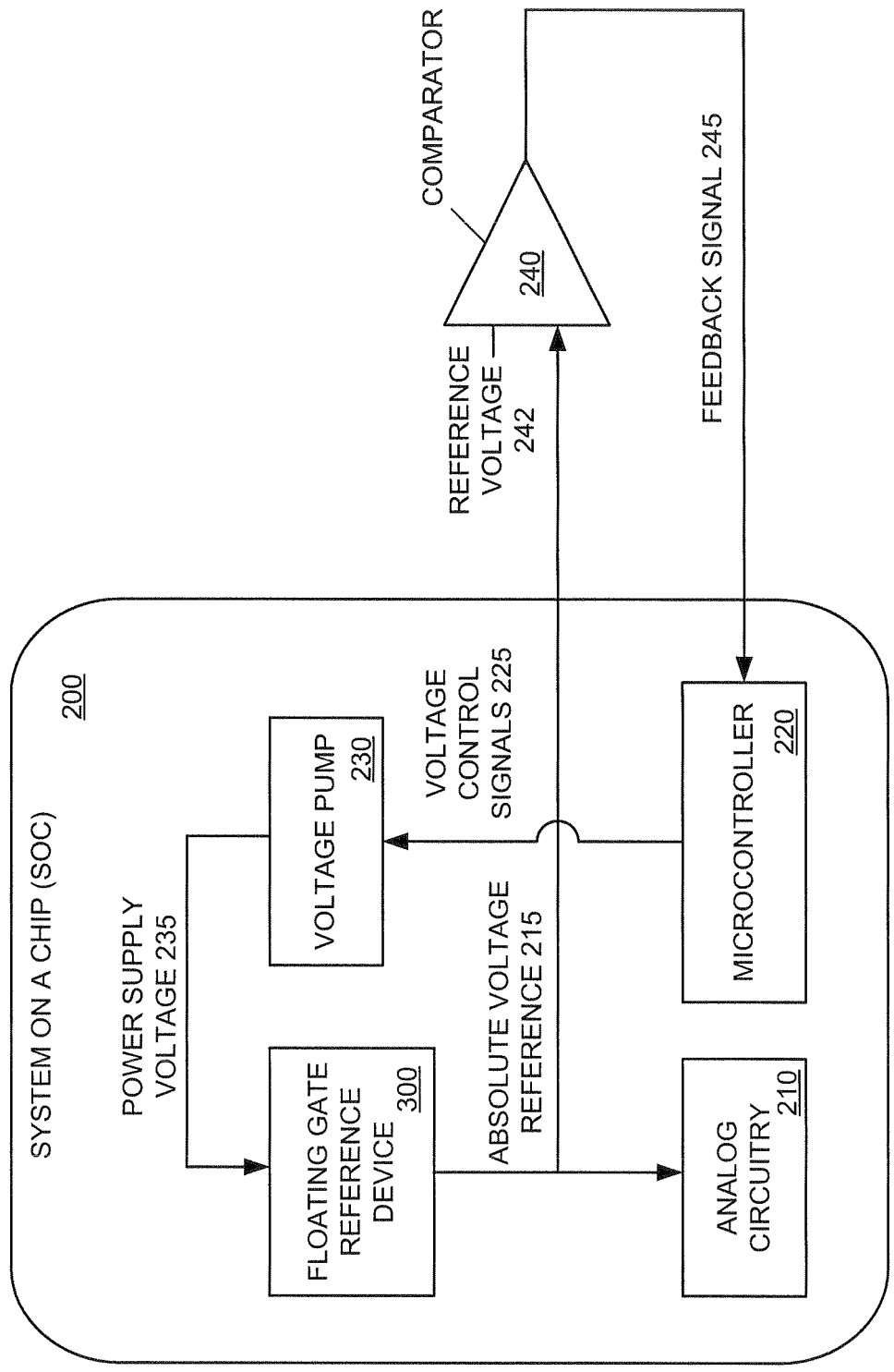
FIG. 2 is a block diagram of another example system on a chip having a floating gate reference device according to embodiments of the invention.

FIG. 2 is a block diagram of another example system on a chip 200 having a floating gate reference device 300 according to embodiments of the invention. Referring to FIG. 2, the system on a chip 200 includes a floating gate reference device 300 to generate an absolute voltage reference 215, for example, to be utilized by analog circuitry 210. The analog circuitry 210 can include one or more analog electronic devices, such as analog-to-digital converters, or other electronic hardware elements. The absolute voltage reference 215 can remain substantially constant over time relative to changes in environmental conditions, such as temperature.

The floating gate reference device 300 can receive a power supply voltage 235 from a voltage pump 230 and generate the absolute voltage reference 215 based on the power supply voltage 235. In some embodiments, the power supply voltage 235 can have a relatively high voltage level, which can cause the floating gate reference device 300 to tunnel electrons through an insulator to charge a floating gate region of the floating gate reference device 300. Embodiments of the floating gate reference device 300 will be described below in greater detail.

The system on a chip includes a microcontroller 220 to control the voltage pump 230 and thus the power supply voltage 235 provided to the floating gate reference device 300. By controlling the power supply voltage 235, the microcontroller 220 can effectively control the operation of the floating gate reference device 300 and the generation of the absolute voltage reference 215. The microcontroller 220 can be a processor, microprocessor, or other controlling device, and in some embodiments, can be implemented in firmware or as a discrete set of hardware elements. Although not shown in FIG. 2, the microcontroller 220 can be coupled to a computer or machine readable medium or other memory device that include instructions, when executed by the microcontroller 220, can cause the microcontroller 220 to perform various functions or operations.

The microcontroller 220 can receive an indication of the absolute voltage reference 215 generated by the floating gate reference device 300. In some embodiments, the floating gate reference device 300 can provide the absolute voltage reference 215 to a comparator 240 for comparison with a reference voltage 242. The comparator 240 can be located externally to the system on a chip 200, and in some embodiments, located within the system on a chip 200. The comparator 240 can compare the absolute voltage reference 215 to the reference voltage 242 and provide a result of the comparison to the microcontroller 220 as a feedback signal 245.

The microcontroller 220 can generate voltage control signals 225 based, at least in part, on the feedback signal 245, and provide the voltage control signals 225 to the voltage pump 230. For instance, the microcontroller 220 can determine when the absolute voltage reference 215 has reached a threshold voltage level and generate voltage control signals 225 that direct the voltage pump 230 to cease providing (or reduce the voltage level) the power supply voltage 235 to the floating gate reference device 300. The voltage pump 230 can be a variable voltage source that is dynamically programmable or controllable responsive to the voltage control signals 225 from the microcontroller 220.

The microcontroller 220 can be programmed or designed to understand the operation of the floating gate reference device 300, particularly, the effect varying the power supply voltage 235 has on the generation of the absolute voltage reference 215. The microcontroller 220 can then generate the voltage control signals 225 based, at least in part, on the operational characteristics of the floating gate reference device 300 and the effect variations in the power supply voltage 235 have on the generation of the absolute voltage reference 215.

The microcontroller 220 can also be programmed or designed to generate the voltage control signals 225 with an understanding of the characteristics of analog circuitry 210 that receives the absolute voltage reference 215, particularly, the effect variation in the absolute voltage reference 215 can have on the operation of the analog circuitry 210. The microcontroller 220 can then generate control signals 225 based, at least in part, on the characteristics of the analog circuitry 210. For instance, operations of analog circuit devices can be adversely impacted when losing an absolute voltage reference 215, and therefore the microcontroller 220 can delay shutting off or reducing the power supply voltage 235 provided to the floating gate reference 300 in an attempt to avoid the adverse consequences. The delay can be programmable based on the characteristics of the particular analog circuit device receiving the absolute voltage reference 215, or can be determined dynamically by monitoring the operation of the analog circuitry 210.

Figure 3:
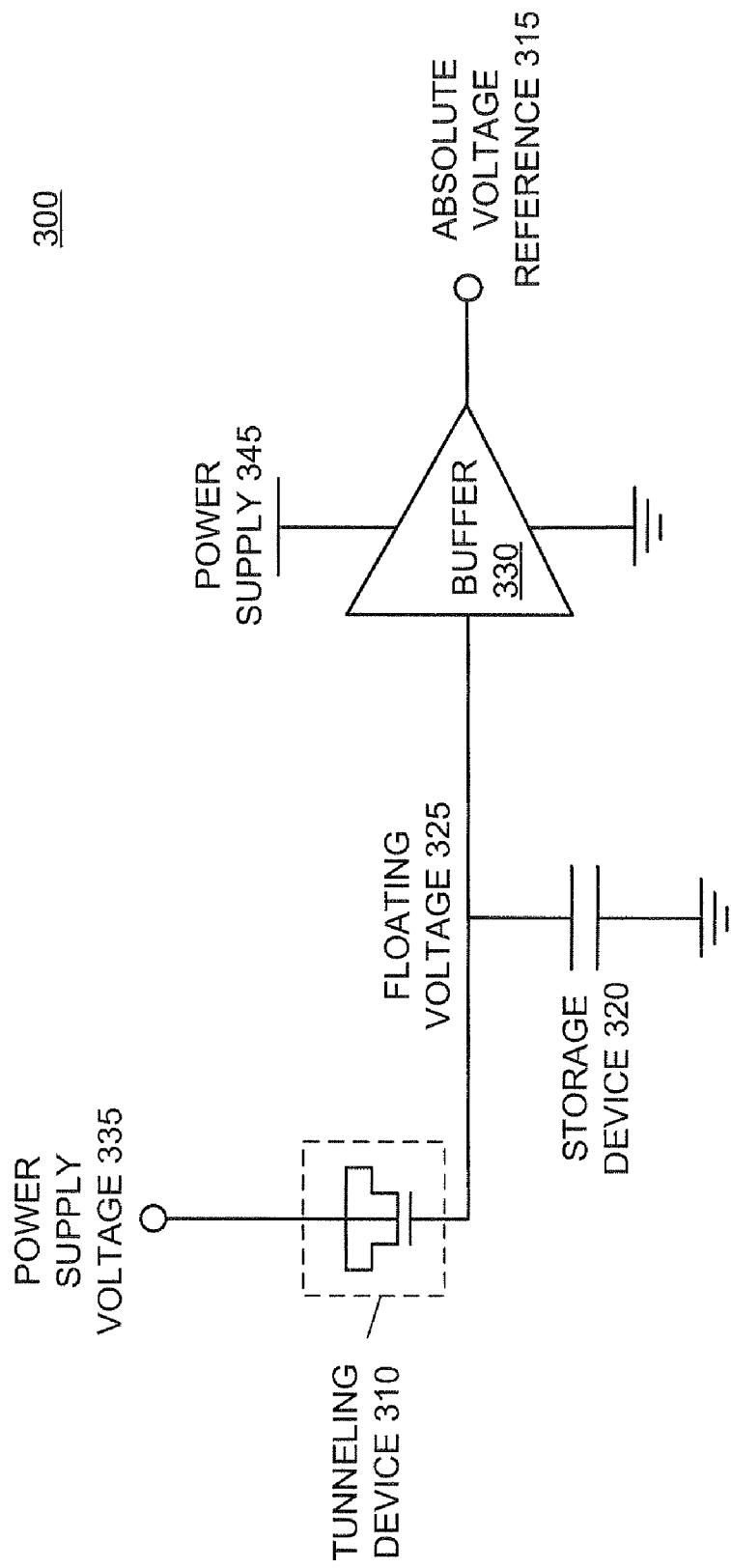
FIG. 3 is a block diagram embodiment of an example floating reference device shown in FIGS. 1 and 2.

FIG. 3 is a block diagram embodiment of an example floating gate reference device 300 shown in FIGS. 1 and 2. Referring to FIG. 3, the floating gate reference device 300 includes a tunneling device 310 to receive a power supply voltage 335 and generate a floating voltage 325 responsive to the power supply voltage 335. For instance, when the power supply voltage 335 reaches a threshold voltage level, electrons can tunnel through the tunneling device 310 for storage in storage device 320. In some embodiments, the storage device 320 is a capacitor and the stored electrons generate a potential across the capacitor 320, i.e., the floating voltage 325.

In some embodiments, the tunneling device 310 can be a transistor having a bulk region, source region, and drain region connected to receive the power supply voltage 335. When the power supply voltage 335 reaches or exceeds the threshold voltage level a current can tunnel through the tunneling device 310 to a gate region of the transistor coupled to the storage device 320. As described above, a voltage level of the power supply voltage 335 can be controlled by the microcontroller 120 or 220, for instance, by generating and providing the voltage control signals 125 or 225 to the voltage pump 130 or 230. The microcontroller 120 or 220 can generate the voltage control signals 125 or 225 based, at least in part, on the absolute voltage reference 115 or 215 generated by the floating gate reference device 300, and delay altering the power supply voltage 135 and 235 according to the characteristics associated with the analog circuitry 110 or 210 powered by the absolute voltage reference 115 or 215.

The amount of charge provided to the storage capacitor 320 and/or current tunneled through the tunneling device 310 is determined according to a voltage level associated with the power supply voltage 335. For instance, when the power supply voltage 330 has a low voltage level, current cannot tunnel through the tunneling device 310, but when the power supply voltage 330 has a high voltage level, current tunnels through the tunneling device 310 to generate the reference voltage 325. The voltage level associated with the power supply voltage 335 can be controlled by the microcontroller 120 or 220 via voltage control signals 125 or 225 to the voltage pump 130 or 230. This controllability in the generation of the floating voltage 325 by a programmable microcontroller 120 or 220, allow the systems 100 and 200 the ability to dynamically and programmably generate an absolute voltage reference 115 and 215 for their respective analog circuits 130 and 230. Since the microcontrollers 120 and 220 can programmably control the absolute voltage reference 315 according to the power supply voltage 335, the systems 100 and 200 can provide the absolute voltage reference 315 to analog circuitry 110 and 210 with timing precision.

The floating gate reference device 300 includes a buffer 330 to receive and buffer the floating voltage 325 stored by the storage device 320. The buffer 330 can operate according to a power supply 345 and output the absolute voltage reference 315, for example, to the analog circuitry 110 or 210. In some embodiments, the buffer 330 can output the buffered floating voltage 325 as the absolute voltage reference 315.

Figure 4:
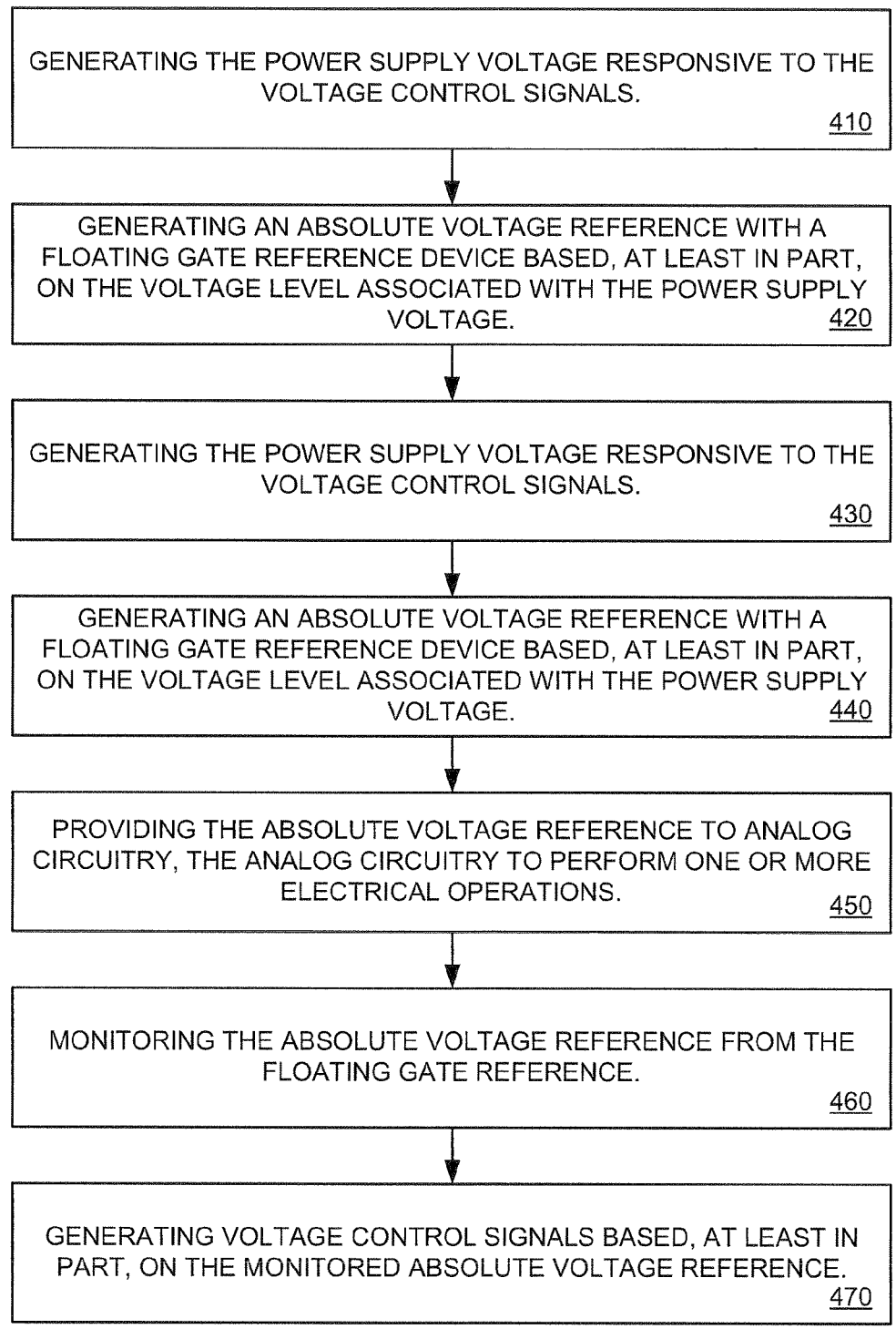
FIG. 4 is an example operational flowchart for the system on a chip with the floating reference device is shown in FIGS. 1-3.

FIG. 4 is an example operational flowchart for the system on a chip with the floating reference device 300 is shown in FIGS. 1-3. Referring to FIG. 4, the flowchart begins at block 410 and determines a voltage level associated with a power supply voltage. In some embodiments, a microcontroller can determine the voltage level of the power supply voltage. The microcontroller can determine the voltage level according to an absolute voltage reference generated by a floating gate reference device 300, by a feedback signal generated by a comparator responsive to the absolute voltage, and/or the characteristics of analog circuitry receiving the absolute voltage reference.

The voltage level can be sufficiently high to induce current tunneling in a floating gate reference device 300, or sufficiently low enough to have current cease flowing in the floating gate reference device 300. The flowchart continues to blocks 420 and 430, where the microcontroller generates voltage control signals identifying the voltage level associated with the power supply voltage and the voltage generator or pump generates the power supply voltage responsive to the voltage control signals. In some embodiments, the microcontroller can generate the voltage control signals to prompt a voltage generator or voltage pump to generate the power supply voltage with the determined voltage level.

The flowchart continues to block 440 and generates an absolute voltage reference with a floating gate reference device based, at least in part, on the voltage level associated with the power supply voltage. In some embodiments, the floating gate reference device 300 includes a tunneling device will tunnel electrons across an insulating material to a gate region when the power supply voltage reaches a threshold level. The floating gate device can also include a storage element or capacitor to be charged by the tunneling current and retain a floating voltage when charged. The floating gate reference device can also include an output buffer to buffer the floating voltage and output the buffered floating voltage as the absolute voltage reference.

The flowchart continues to block 450 and provides the absolute voltage reference to analog circuitry, the analog circuitry to perform one or more electrical operations responsive to the absolute voltage reference.

The flowchart continues to block 460 and monitors the absolute voltage reference from the floating gate reference. In some embodiments, a comparator can compare the absolute voltage reference from the floating gate reference device and generate a feedback signal responsive to the comparison. The microcontroller can also receive the absolute voltage reference directly from the floating gate reference device.

The flowchart continues to block 470 and generates voltage control signals based, at least in part, on the monitored absolute voltage reference. The microcontroller can generate voltage control signals based, at least in part, on the feedback signal from the comparator or on the absolute voltage reference received directly from the floating gate reference device. The voltage control signals can prompt the voltage generator or pump to generate a power supply voltage with a different voltage level, which causes the floating gate reference device to cease or initiate generating the absolute voltage reference.

In some embodiments, the microcontroller can generate the voltage control signals according to the characteristics of the analog circuitry. For instance, the microcontroller can delay initiating or shutting off the absolute voltage reference according to knowledge of the operations of the analog circuitry, particularly, any negative impact the absolute voltage (or lack thereof) will have on analog circuitry operation.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

The invention claimed is:

1. A system comprising:
a controllable voltage generator to generate a power supply voltage, wherein the controllable voltage generator is a variable voltage source that is controllable responsive to a voltage control signal;
a system controller to determine a voltage level associated with the power supply voltage, and prompt the controllable voltage generator to generate the power supply voltage with the determined voltage level using the voltage control signal; and
a floating gate reference device to generate an absolute voltage reference based, at least in part, on the voltage level associated with the power supply voltage.

2. The system of claim 1, where the system controller is operable to generate the voltage control signal identifying the voltage level for the power supply voltage, and the controllable voltage generator is operable to generate the power supply voltage according to the voltage control signal.

3. The system of claim 2, further comprising a comparator to compare the absolute voltage reference with a reference voltage and to generate a feedback signal according to the comparison, the system controller to generate the voltage control signal based, at least in part, on the feedback signal.

4. The system of claim 2, where the system controller is operable to receive the absolute voltage reference from the floating gate reference device and to generate the voltage control signal based, at least in part, on the absolute voltage reference.

5. The system of claim 2, including analog circuitry to perform one or more electrical operations responsive to the absolute voltage reference, where the system controller is operable to generate voltage control signal based, at least in part, on operational characteristics of the analog circuitry and the absolute voltage reference.

6. The system of claim 1, wherein the floating gate reference device comprises:
a tunneling device to generate a current according to the power supply voltage from the controllable voltage generator;
a storage capacitor to store a floating voltage when charged by the current from the tunneling device; and
an output buffer to buffer the floating voltage and output the buffered floating voltage as the absolute reference voltage.

7. The system of claim 6, wherein the tunneling device is a transistor with a bulk region, source region, and drain region connected to receive the power supply voltage, wherein the tunneling device is operable to provide the current to a gate region of the transistor when the power supply voltage exceeds a threshold voltage level.

8. The system of claim 1 wherein the controllable voltage generator is a voltage pump.

9. A method comprising:
determining a voltage level associated with a power supply voltage;
generating a voltage control signal identifying the voltage level associated with the power supply voltage responsive to the determining;
controlling a variable voltage source using the voltage control signal to generate the power supply voltage at the determined voltage level;
generating the power supply voltage to the determined voltage level according to the voltage control signal;
generating an absolute voltage reference with a floating gate reference device based, at least in part, on the voltage level associated with the power supply voltage.

10. The method of claim 9 further comprising:
receiving the absolute voltage reference from the floating gate reference device; and
generating the voltage control signal based, at least in part, on the absolute voltage reference.

11. The method of claim 9 further comprising:
comparing the absolute voltage reference with a reference voltage;
generating a feedback signal according to the comparison of the absolute voltage reference and the reference voltage; and generating the voltage control signal based, at least in part, on the feedback signal.

12. The method of claim 9 further comprising providing the absolute voltage reference to analog circuitry, the analog circuitry to perform one or more electrical operations responsive to the absolute voltage reference.

13. The method of claim 12 further comprising generating voltage control signal based, at least in part, on operational characteristics of the analog circuitry.

14. A system comprising:
a system controller to control a variable voltage source using a voltage control signal to generate a controllable power supply voltage;
a floating gate reference device to generate an absolute voltage reference based, at least in part, on the controllable power supply voltage; and
analog circuitry to perform one or more electrical operations responsive to the absolute voltage reference from the floating gate reference device.

15. The system of claim 14, wherein the system controller is operable to receive the absolute voltage reference from the floating gate reference device and to generate the voltage control signal based, at least in part, on the absolute voltage reference.

16. The system of claim 15, wherein the floating gate reference device comprises:
a tunneling device to generate a current according to the controllable power supply voltage;
a storage element to store a floating voltage when charged by the current from the tunneling device; and
an output buffer coupled to the storage element and the tunneling device, the output buffer to buffer the floating voltage and to output the buffered floating voltage as the absolute reference voltage.

17. The system of claim 16, wherein the tunneling device is a transistor with a bulk region, source region, and drain region connected to receive the controllable power supply voltage, wherein the tunneling device is operable to provide the current to a gate region of the transistor when the controllable power supply voltage exceeds a threshold voltage level.

18. The system of claim 16, wherein a voltage level of the floating voltage corresponds to a size of the storage element and the current from the tunneling device.

19. The system of claim 14, further comprising a comparator to compare the absolute voltage reference with a reference voltage and to generate a feedback signal according to the comparison, the system controller to generate the voltage control signal based, at least in part, on the feedback signal.

20. The system of claim 19, wherein the system controller is operable to generate the voltage control signal based, at least in part, on operational characteristics of the analog circuitry and the feedback signal.

* * * * *